(12) United States Patent
Joos

(10) Patent No.: US 9,787,186 B2
(45) Date of Patent: Oct. 10, 2017

(54) AREA-FRIENDLY METHOD FOR PROVIDING DUTY CYCLE INVERSE TO SUPPLY VOLTAGE

(71) Applicant: SEMICONDUCTOR COMPONENTS INDUSTRIES, LLC, Phoenix, AZ (US)

(72) Inventor: Dieter Joos, Kapelle-op-den-Bos (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/092,904

(22) Filed: Apr. 7, 2016

(65) Prior Publication Data
US 2017/0126126 A1    May 4, 2017

Related U.S. Application Data

(60) Provisional application No. 62/248,793, filed on Oct. 30, 2015.

(51) Int. Cl.
*H02M 3/156*    (2006.01)
*H02M 3/158*    (2006.01)
*H02M 3/155*    (2006.01)

(52) U.S. Cl.
CPC .... *H02M 3/158* (2013.01); *H02M 2003/1557* (2013.01)

(58) Field of Classification Search
CPC . H02M 2001/0003; H02M 2001/0016; H02M 2001/0022; H02M 2001/0032; H02M 3/156; H02M 2001/0025
See application file for complete search history.

(56) References Cited

U.S. PATENT DOCUMENTS

| 6,498,617 | B1 | 12/2002 | Ishida et al. |
| 6,922,346 | B2 | 7/2005 | Wofford et al. |
| 7,271,754 | B2 | 9/2007 | Maksimovic et al. |
| 8,129,969 | B1 * | 3/2012 | Chui ............... H02M 3/157 323/283 |

(Continued)

OTHER PUBLICATIONS

John Caldwell, "TI Precision Designs: Verified Design, Analog Pulse Width Modulation," SLAU508—Jun. 2013—Revised Jun. 2013, 21 pages; http://www.ti.com/lit/ug/slau508/slau508.pdf.

*Primary Examiner* — Gary L Laxton
(74) *Attorney, Agent, or Firm* — Iselin Law, PLLC

(57) ABSTRACT

An illustrative converter embodiment employs an oscillator comprising a capacitor and a comparator. The capacitor is alternately coupled to a charging current source and a discharging current source, the charging current source operating to charge the capacitor at a first rate and the discharging source operating to discharge the capacitor at a second rate. The comparator asserts an output signal when the capacitor charges to a first threshold voltage and deasserts the output signal when the capacitor discharges to a second threshold voltage. The first rate may be proportional to the input voltage and the second rate may be fixed. The output signal may be applied to the gate of a transistor to alternately apply the input voltage across an inductor and to apply current from the inductor to a capacitance. The duty cycle of the output signal is inversely proportional to the input voltage, or at least approximately so.

13 Claims, 1 Drawing Sheet

(56) References Cited

U.S. PATENT DOCUMENTS

| | | | |
|---|---|---|---|
| 8,830,405 B2* | 9/2014 | Murakami | H02M 3/156 219/666 |
| 2011/0140684 A1* | 6/2011 | Chen | H02M 1/40 323/351 |

* cited by examiner

AREA-FRIENDLY METHOD FOR PROVIDING DUTY CYCLE INVERSE TO SUPPLY VOLTAGE

CROSS-REFERENCE TO RELATED APPLICATION

This application claims priority to U.S. Provisional Application No. 62/248,793 filed on Oct. 30, 2015, entitled "AREA-FRIENDLY METHOD FOR PROVIDING DUTY CYCLE INVERSE TO SUPPLY VOLTAGE," invented by Dieter Joos, and is incorporated herein by reference and priority thereto for common subject matter is hereby claimed.

BACKGROUND

Inductive converters such as the buck converter, the boost converter, the buck-boost converter, the Cuk converter, and the single-ended primary-inductor converter (SEPIC), may offer numerous advantages. However, care should be taken to protect the inductor(s) by keeping the inductor currents within predefined limits. In particular, if inductor currents pass the point where the inductor cores reach magnetic saturation, the inductors' impedance drops almost all the way to the (small) resistance value of the wiring. The inductor current accordingly exhibits a sharp increase beyond this point, typically causing an excessive amount of heat energy to be dissipated in the inductor, leading to a rapid electrical component failure.

It is relatively straightforward to design the inductive converter circuitry when the input voltage is expected to be relatively well controlled. However, where the input voltage is expected to vary over a wide range (e.g., 2 to 40 volts), it becomes significantly more challenging to achieve a consistently high conversion efficiency while providing adequate protection to the inductors. Typically, a significant number of additional components are required, with corresponding areal and commensurate power requirements.

SUMMARY

Accordingly, there are disclosed herein various systems and methods using pulse width modulation to protect inductor(s) by operating them with a duty cycle that is inversely proportional to the supply voltage. The disclosed systems and methods have minimal areal and power requirements, enabling the converter to maintain a high conversion efficiency. One illustrative converter embodiment employs an oscillator comprising a capacitor and a comparator. The capacitor is alternately coupled to a charging current source and a discharging current source, the charging current source operating to charge the capacitor at a first rate and the discharging source operating to discharge the capacitor at a second rate. The comparator asserts an output signal when the capacitor charges to a first threshold voltage and deasserts the output signal when the capacitor discharges to a second threshold voltage. The first rate may be proportional to the input voltage and the second rate may be fixed. The output signal may be applied to the gate of a transistor to alternately apply the input voltage across an inductor and to apply current from the inductor to a capacitance. The duty cycle of the output signal is inversely proportional to the input voltage, or at least approximately so. For example, the duty cycle may be $1/(S+1)$, where S is the input voltage. In at least some embodiments, the period of the output signal is relatively constant, with an input voltage dependence of $(S+1)/S$. Some oscillator embodiments may include selectable sources for charging the capacitor at different rates. For example, one rate may be inversely proportional to the voltage as described above, while another rate may be fixed. Such selectability enables the duty cycle to be set according to the operating mode of the converter.

It should be understood that the drawings and corresponding detailed description do not limit the disclosure, but on the contrary, they provide the foundation for understanding all modifications, equivalents, and alternatives falling within the scope of the appended claims.

DETAILED DESCRIPTION

Figure 1:
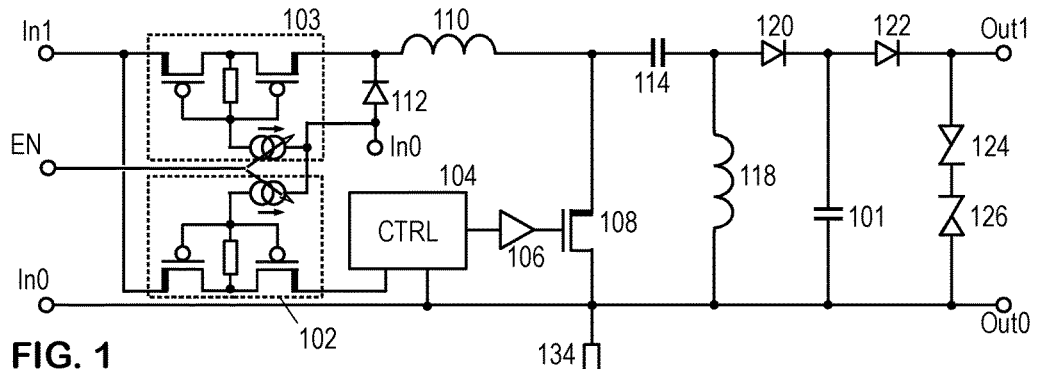
FIG. 1 is an illustrative inductive converter schematic.

FIG. 1 is a schematic of an illustrative single-ended primary-inductor converter (SEPIC) capable of operating in a burst ("charging") mode to recharge an output capacitor 101 from about 11 V to about 15 V from an input voltage ranging from 2 to 40 V, while consuming no more than about 1 mW. Once the output capacitor has been charged to a desired voltage range, the converter enters a low-power ("discharging") mode where it passively monitors the output capacitor voltage while consuming minimal power.

The converter receives the input voltage between input terminals IN1 and IN0, with IN0 serving as the low voltage rail and IN1 serving as the high voltage rail. An enable signal EN controls two antiseries switches 102, 103, turning them "ON" when asserted. Switch 102 couples the high voltage rail to control unit 104, while switch 103 couples the high voltage rail to the main circuitry of the converter. Switches 102, 103 further protect against backsupply and provide a current limiting function in the event of a short circuit.

In addition to providing internal voltage regulation and logic to support interface requirements, control unit 104 drives the main circuitry of the converter by applying a pulse-width modulated gate signal (via a buffer 106) to MOSFET 108 when the converter is in charging mode. (In the discharging mode, the gate signal is held low until the output capacitor voltage falls below the desired voltage range.) When the gate signal is asserted, MOSFET 108 closes a conductive path between the input terminals IN1 and IN0, enabling the input voltage to induce a current in the primary inductor 110. The inductor current continues to increase for so long as the gate signal remains asserted. (A shunt diode 112 prevents arcing if the enable signal is unexpectedly deasserted while the inductor is carrying a significant current.) When the gate signal is deasserted, MOSFET 108 opens the conductive path, forcing the inductor current to charge the coupling capacitor 114. After a few conversion cycles the coupling capacitor 114 reaches a steady state value such that the voltage that charges the secondary inductor 118 is equal to the voltage that charges the primary inductor 110 when switch 108 is closed.

When the conductive path again closes due to re-assertion of the gate signal, the current through the primary inductor again increases. As the same time, the voltage from the charged capacitor 114 induces a current through the secondary inductor 118. When the gate signal is subsequently deasserted, the current from the primary and the secondary inductor 118 charges the output capacitor 101 via a charging diode 120. The output capacitor 101 supplies power to the output terminals OUT1 and OUT0 via a discharging diode 122. Voltage clamps 124, 126 prevent the voltage between the output terminals from exceeding specifications. Control unit 104 monitors the output capacitor voltage, switching between charging and discharging mode as needed to keep the output capacitor voltage in the desired range.

Thus voltage conversion and regulation is efficiently obtained via a sequence of energy conversions (from source voltage to primary inductor current to coupling capacitor voltage to secondary inductor current to output capacitor voltage) that are controlled by the control unit 104. (Parasitic ground voltage offset 132 and ground impedance 134 are included for modeling purposes, but do not affect the operation of the circuit.) So long as the de-assertion time of the gate signal is short enough to prevent the primary inductor current from falling to zero, for a given input voltage the assertion time of the gate signal determines how much energy is transferred on each cycle and the cycle period determines how frequently that energy transfer occurs. The control unit 104 may monitor the voltage on the output capacitor 101 and modify the gate signal accordingly.

The input voltage is also a key factor in determining the primary inductor current (and hence the amount of energy transferred in each cycle). Control unit 104 accordingly monitors and accommodates input voltage variation as discussed in greater detail below.

To maintain a high conversion efficiency, it is important that the power consumption of the control unit 104 be kept minimal. Accordingly, unit preferably generates the gate signal using an oscillator design having no more than one comparator or operational amplifier, such as that shown in FIG. 2. Moreover, the unit preferably includes no more than one oscillator, necessitating that the oscillator output serve as a clock signal for any control circuitry requiring one. In particular, control unit 104 may include a clock-driven digital counter that periodically "awakens" the control unit to test the output capacitor voltage and determine whether or not to transition to the charging mode.

Figure 2:
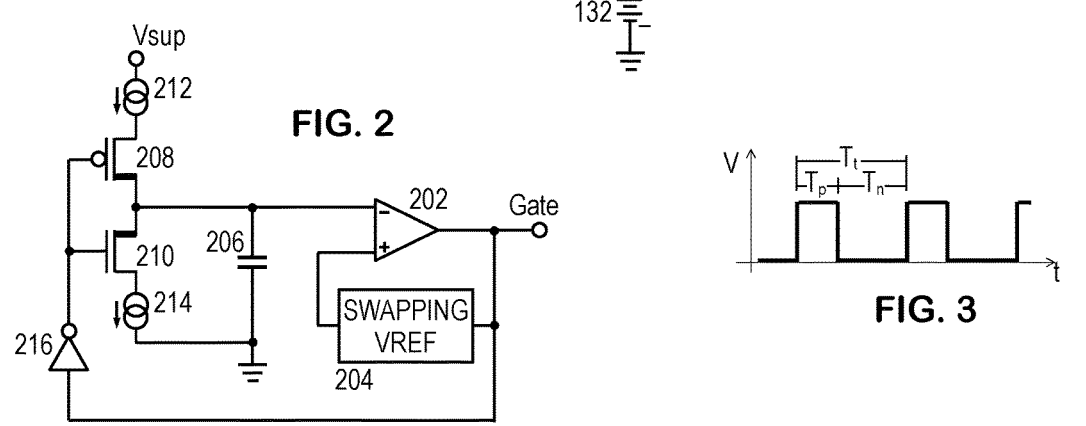
FIG. 2 is a schematic of an oscillator with a fixed duty cycle.

In FIG. 2, the oscillator has one comparator 202 with a swapping voltage reference 204 coupled to its non-inverting input and a capacitor 206 coupled to its inverting input. When the capacitor voltage is below the reference voltage, the comparator output is high. Conversely, when the capacitor voltage is above the reference voltage, the comparator output is low. To provide hysteresis, the reference voltage swaps between a high threshold when the comparator output is high and a low threshold when the comparator output is low. The difference between the thresholds is preferably kept relatively small to minimize energy lost to charging and discharging of the capacitor. A suitable threshold difference is the value of a standard bandgap voltage Vbg, i.e., about 1.2 V, and this is the value used for the calculations below. Smaller threshold differences may also be used, e.g., a voltage derived from Vbg using a voltage divider.

Complementary metal-oxide-semiconductor (CMOS) transistors 208, 210 alternately couple a charging current source 212 and a discharging current source 214 to the capacitor 206 to alternately raise and lower the capacitor voltage. An inverter 216 supplies an inverted version of the comparator output signal to the gates of transistors 208, 210. When the comparator output signal is low, the gates of CMOS transistors 208, 210 are asserted, turning off transistor 208 and turning on transistor 210, causing the capacitor to discharge at a rate governed by the discharging current source 214. Once the capacitor voltage falls below the lowest reference voltage, the comparator output signal goes high, the reference voltage toggles to the highest reference voltage and the transistor states are reversed, causing the capacitor to charge at a rate governed by the charging current source.

Figure 3:
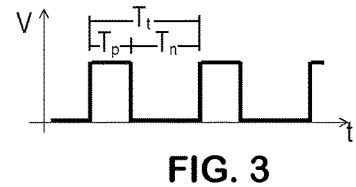
FIG. 3 is a clock signal graph showing portions of a duty cycle.

FIG. 3 shows an illustrative gate signal produced by the oscillator. The gate signal switches in a periodic fashion between high and low states. The signal is high for a time Tp and low for a time Tn, which together add up to a signal period of Tt. Duty cycle is defined as the ratio Tp/Tt, and in percentage terms is expressible as 100% ×Tp/Tt. Where the charging and discharging currents are equal, the comparator output is a clock signal with a 50% duty cycle.

The frequency of the gate signal is 1/Tt. An illustrative embodiment employs current mirrors as the current sources based on a current through a reference resistance R, providing charging and discharging currents Ip, In, equal to Vbg/R. Taking C as the value of the capacitor, the assertion (gate signal is high) time and deassertion (gate signal is low) times each equal RC, for a signal period of 2RC and frequency of 1/2RC. With the fixed currents, the duty cycle is set at 50% and fails to account for any variation in supply voltage.

To account for supply voltage variation, one or both of the current sources should vary. In particular, to make the rate of energy transfer independent of supply voltage, the duty cycle should be made inversely proportional to the supply voltage while keeping the signal period Tt fixed. Representing the supply voltage as S, these constraints are satisfied by setting the charging current Ip and discharging current In as follows:

$$I_p = S \frac{CV_{bg}}{T_t}; \text{ and} \quad (1)$$

$$I_n = \frac{S}{(S-1)} \frac{CV_{bg}}{T_t}. \quad (2)$$

Setting the charging current $I_p$ can accordingly be achieved by applying the supply voltage across a fixed resistance alone or in combination with transistor network for buffering and optionally amplifying the current signal. However, implementing the S/(S−1) formula for the discharge current $I_n$ may require an additional op amp with supporting components in the supply voltage domain and consequent power consumption.

To avoid this, the discharging current In is set at a constant value while the charging current varies:

$$I_n = \frac{V_{bg}}{R_n}; \text{ and} \quad (3)$$

$$I_p = \frac{S}{R_p}, \quad (4)$$

where Rn is chosen to be Tt/C (with Rp=Rn/Vbg) to set the nominal signal period to about Tt. However, since the deassertion time Tn is now fixed while the assertion time Tp varies, the actual signal period will vary according to:

$$T'_t = R_nC\left(1 + \frac{1}{S}\right) \quad (5)$$

Figure 5:
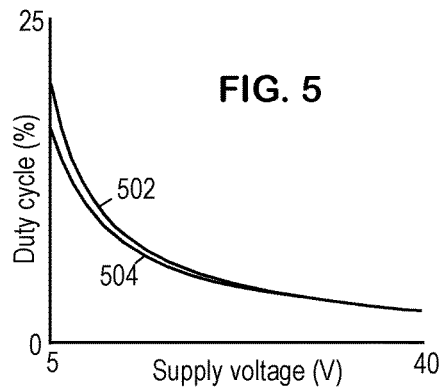
FIG. 5 is a graph of implemented and ideal duty cycle dependences.

The duty cycle becomes:

$$D = \frac{1}{(S+1)} \times 100\% \quad (6)$$

rather than the ideal 1/S. As shown in FIG. 5, the approximation may nevertheless be suitable. Curve 502 represents the ideal 1/S while curve 504 represents the approximation 1/(S+1). Accordingly, charging current source 212 may implement equation (4) to provide approximate compensation for supply voltage variation.

Figure 4:
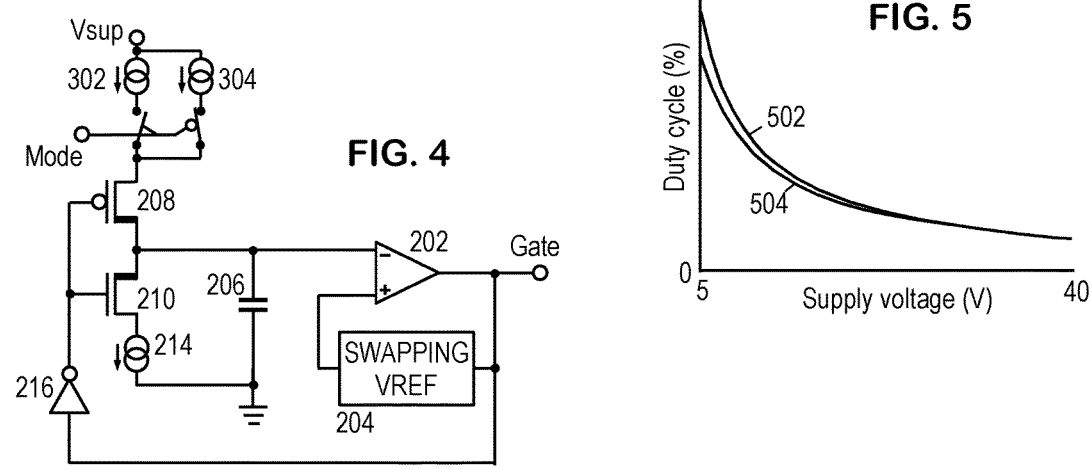
FIG. 4 is a schematic of an oscillator that is switchable between a fixed duty cycle and supply-voltage dependent duty cycle.

Although the 1/S duty cycle is desirable for driving MOSFET 108 during the charging mode, it does not represent the optimal duty cycle for minimizing the oscillator's power consumption during the discharging mode. The illustrated oscillator implementation is suitable for synchronous, glitch-free duty cycle switching between the 1/S duty cycle and a 50% duty cycle that consumes less current. FIG. 4 shows an illustrative oscillator implementation that advantageously provides glitch-free mode switching.

In FIG. 4, the charging current source 212 has been replaced by a plurality of selectable charging current sources 302, 304. Charging current source 302 may provide, for example, a fixed charging current Ip equal to Vbg/Rn, while current source 304 may provide, for example, a charging current Ip=S/Rp. A mode signal may be used to switch between the charging current sources. When the fixed charging current source 302 is selected (for the discharging mode), the oscillator outputs a gate signal with a fixed 50% duty cycle irrespective of the input voltage, whereas when the variable current source 304 is selected (for driving MOSFET 108 in the charging mode), the oscillator outputs a gate signal with the duty cycle provided by equation (6). Such switching can advantageously be accomplished without introducing any glitches in the gate signal or the voltage of the output capacitor. Moreover, the illustrated oscillator operates comfortably below a current consumption limit of 7 uA.

In some embodiments, the mode switching is performed from a fixed duty cycle to a variable duty cycle when the supply voltage exceeds some threshold where the primary inductor current should begin being limited. In other embodiments, the mode switching is performed when the converter is disabled to permit discharging of the output capacitor.

The foregoing devices and methods are suitable for controlling inductive converters in many applications having to cope with a large range of input voltages, including automotive applications, energy scavenging applications, solar and wind energy applications. The low-complexity design minimizes power requirements of the control unit and lends itself to many variations and alternative embodiments. For example the polarity of the gate signal may be reversed and applied to a pMOSFET instead of nMOSFET 108, in which case the discharging current source may be varied rather than the charging current source. Other approximations to the desired 1/S duty cycle dependence may be implemented. Additional selectable current sources may be included with different variations to be used in different ranges of the input voltage. The inverter 216 can be omitted if the inputs to the comparator are reversed and along with the response of the swapping voltage reference. These and numerous other modifications, equivalents, and alternatives, will become apparent to those skilled in the art once the above disclosure is fully appreciated. It is intended that the following claims be interpreted to embrace all such modifications, equivalents, and alternatives where applicable.

What is claimed is:

1. An inductive converter that comprises:
   a primary inductor;
   a transistor that alternately applies an input voltage to the primary inductor and applies a current from the primary inductor to a capacitance; and
   a control unit that includes an oscillator providing a gate signal to the transistor, the gate signal having a duty cycle that is approximately inversely proportional to the input voltage,
   wherein the oscillator comprises:
      a capacitor that is alternately coupled to a charging current source and a discharging current source, the charging current source operating to charge the capacitor at a rate proportional to the input voltage and the discharging current source operating to discharge the capacitor at a fixed rate;
      a comparator that asserts an output signal when the capacitor charges to a first threshold voltage and deasserts the output signal when the capacitor discharges to a second threshold voltage; and
      a swapping voltage reference that alternately supplies the first and second threshold voltages to the comparator.

2. The converter of claim 1, wherein the duty cycle equals 1/(S+1), where S is the input voltage.

3. The converter of claim 1, wherein the charging current source is one of a plurality of selectable charging current sources to provide the gate signal with a selectable duty cycle.

4. The converter of claim 3, wherein a second charging current source of the plurality charges the capacitor at a fixed rate to provide the gate signal with a duty cycle of 50%.

5. The converter of claim 1, wherein the oscillator further comprises CMOS transistors that alternately couple the charging current source and discharging current source to the capacitor in response to the output signal.

6. An inductive DC/DC conversion method that comprises:
   supplying a gate signal to alternately apply an input voltage across a primary inductor and apply a current from the primary inductor to a capacitance that directly or indirectly supplies an output voltage, wherein said supplying includes:
      alternately coupling a capacitor to a charging source and a discharging source, the charging source operating to charge the capacitor at a first rate and the discharging source operating to discharge the capacitor at a second rate;
      alternately supplying first and second threshold voltages to a comparator with a swapping voltage reference; and
      using the comparator to assert the gate signal when the capacitor charges to the first threshold voltage and to deassert the output signal when the capacitor discharges to the second threshold voltage; and
   setting a duty cycle of the gate signal in an approximately inverse relationship to the input voltage, wherein said setting includes:

adjusting the first rate to be proportional to the input voltage while maintaining the second rate at a fixed value.

7. The method of claim 6, wherein said setting maintains the duty cycle at 1/(S+1), where S is the input voltage.

8. The method of claim 6, further comprising selecting a duty cycle of the gate signal to be 50% in a low power mode.

9. An inductive converter that comprises:
a primary inductor;
a transistor that alternately applies an input voltage to the primary inductor and applies a current from the primary inductor to a capacitance; and
a control unit that includes an oscillator providing a gate signal to the transistor, the gate signal having selectable duty cycles including a duty cycle that is approximately inversely proportional to the input voltage,
wherein the oscillator comprises:
a capacitor that is alternately coupled to a charging current source and a discharging current source, the charging current source operating to charge the capacitor at a rate proportional to the input voltage and the discharging current source operating to discharge the capacitor at a fixed rate; and
a comparator that asserts an output signal when the capacitor charges to a first threshold voltage and deasserts the output signal when the capacitor discharges to a second threshold voltage,
wherein the charging current source is one of a plurality of selectable charging current sources to provide the gate signal with said selectable duty cycles.

10. The converter of claim 9, wherein the duty cycle equals 1/(S+1), where S is the input voltage.

11. The converter of claim 9, wherein a second charging current source of the plurality charges the capacitor at a fixed rate to provide the gate signal with a duty cycle of 50%.

12. The converter of claim 9, wherein the oscillator further comprises a swapping voltage reference that alternately supplies the first and second threshold voltages to the comparator.

13. The converter of claim 9, wherein the oscillator further comprises CMOS transistors that alternately couple one of the plurality of selectable charging current sources, and the discharging current source to the capacitor, in response to the output signal.

* * * * *